(12) United States Patent
Miura et al.

(10) Patent No.: US 9,699,930 B2
(45) Date of Patent: Jul. 4, 2017

(54) ELECTRIC DEVICE SYSTEM

(71) Applicant: OMRON Corporation, Kyoto-shi, Kyoto (JP)

(72) Inventors: Kazuyoshi Miura, Ohtsu (JP); Jun Yamane, Kyoto (JP); Yoshimi Azuma, Moriyama (JP); Shinya Iwasaki, Ritto (JP); Taisuke Yamada, Kusatsu (JP); Motoyuki Tomizu, Okayama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/948,410

(22) Filed: Nov. 23, 2015

(65) Prior Publication Data

US 2016/0205801 A1 Jul. 14, 2016

(30) Foreign Application Priority Data

Jan. 9, 2015 (JP) ................. 2015-003104

(51) Int. Cl.
*H05K 7/14* (2006.01)
*H01R 13/24* (2006.01)
(Continued)

(52) U.S. Cl.
CPC ....... *H05K 7/1474* (2013.01); *H01R 13/2492* (2013.01); *H01R 13/514* (2013.01);
(Continued)

(58) Field of Classification Search
CPC .... H05K 1/181; H05K 1/0283; H05K 7/1467; H05K 7/1465; H05K 7/1414;
(Continued)

(56) References Cited

U.S. PATENT DOCUMENTS 6,038,130 A    3/2000   Boeck et al.
6,692,310 B2 *   2/2004   Zaderej ................ H01R 13/514
                                                                        439/541.5

(Continued)

FOREIGN PATENT DOCUMENTS

EP     1798822 A1   6/2007
JP     H06-6051 A   1/1994
(Continued)

*Primary Examiner* — Anthony Haughton
*Assistant Examiner* — Ingrid Wright
(74) *Attorney, Agent, or Firm* — Mots Law, PLLC

(57) ABSTRACT

An electric device system includes a first unit and a second unit adjacent to each other. An elastically deformable first connecting terminal is provided in the first unit, and a second connecting terminal is provided in the second unit. When the first unit is assembled in the second unit, the first connecting terminal comes into contact with the second connecting terminal after sliding on an outer surface of a casing of the second unit. A bulging surface is provided in an exposed surface of the first connecting terminal, and a recess is provided in an exposed surface of the second connecting terminal. A part of the bulging surface and a part of an opening edge of the recess come into press-contact with each other by fitting a part of the bulging surface in the recess, thereby establishing electric conduction between the first connecting terminal and the second connecting terminal.

9 Claims, 12 Drawing Sheets

(51) Int. Cl.
*H01R 13/514* (2006.01)
*H01R 9/26* (2006.01)

(52) U.S. Cl.
CPC ......... *H05K 7/1465* (2013.01); *H05K 7/1467* (2013.01); *H01R 9/2675* (2013.01); *H01R 13/2442* (2013.01)

(58) Field of Classification Search
CPC .. H05K 7/1474; H05K 7/1478; H05K 5/0021; H01R 13/514; H01R 13/2492; H01R 9/2675; H01R 13/2442; H01R 9/2608; H01R 9/2691; H01R 25/14; H01R 25/142; H01R 13/426; H01R 13/518; G06F 1/1632; G06F 1/181; G06F 1/1681; G06F 1/1656; G06F 1/187; G11B 33/124; G11B 33/125
USPC ....... 361/679.31, 679.4, 735, 729, 731, 732, 361/796, 797, 803, 730; 439/140, 141, 439/289, 700, 824, 716, 717, 928
See application file for complete search history.

(56) References Cited

U.S. PATENT DOCUMENTS

2006/0205290 A1  9/2006  Narita
2007/0141867 A1  6/2007  Kishi et al.

FOREIGN PATENT DOCUMENTS

| JP | 2001-217016 A | 8/2001 |
| JP | 2007-053066 A | 3/2007 |
| JP | 2007-080843 A | 3/2007 |
| JP | 2012-182412 A | 9/2012 |
| WO | 9710692 A1 | 3/1997 |

* cited by examiner

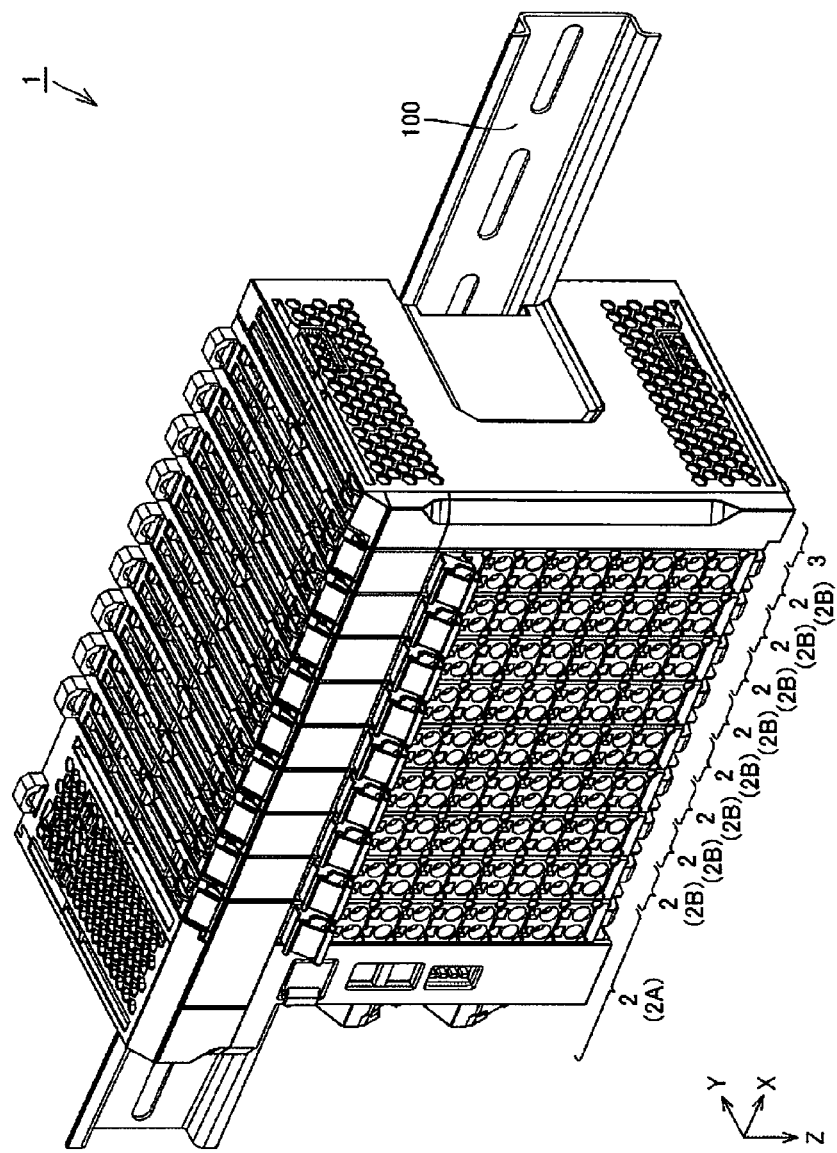

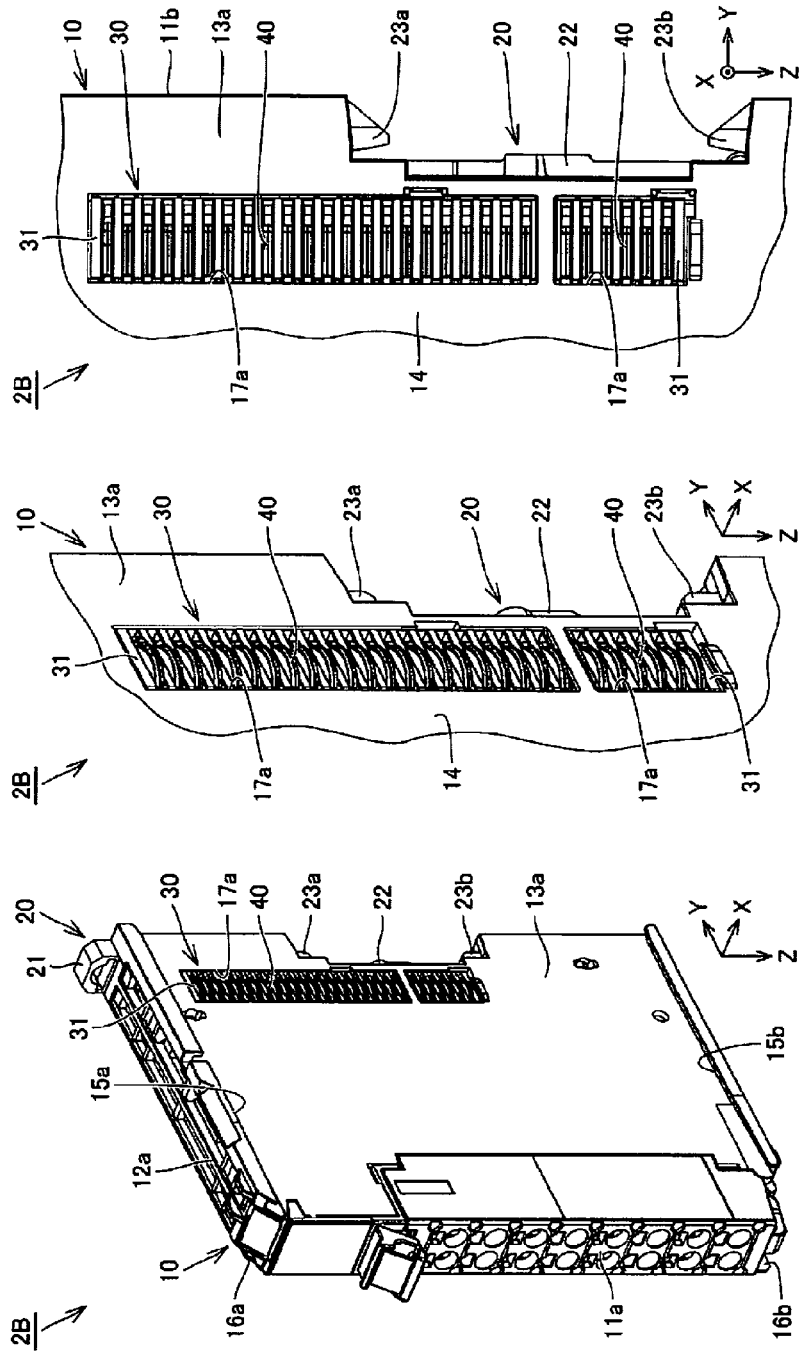

FIG. 4A
FIG. 4B
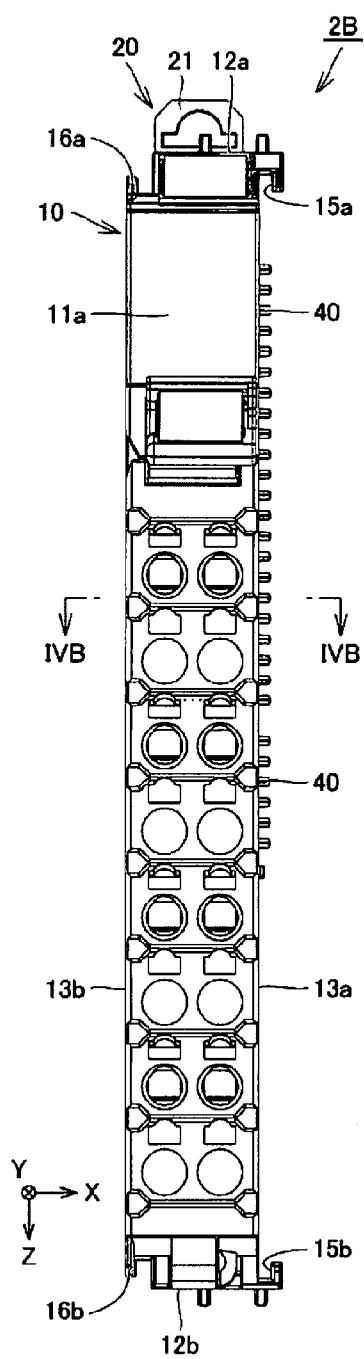
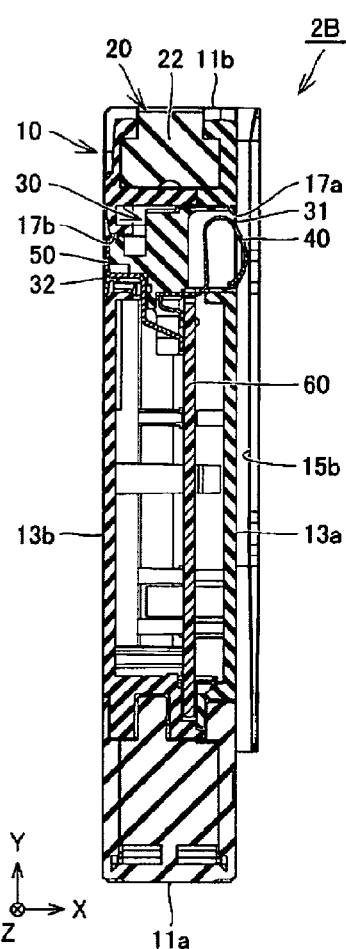

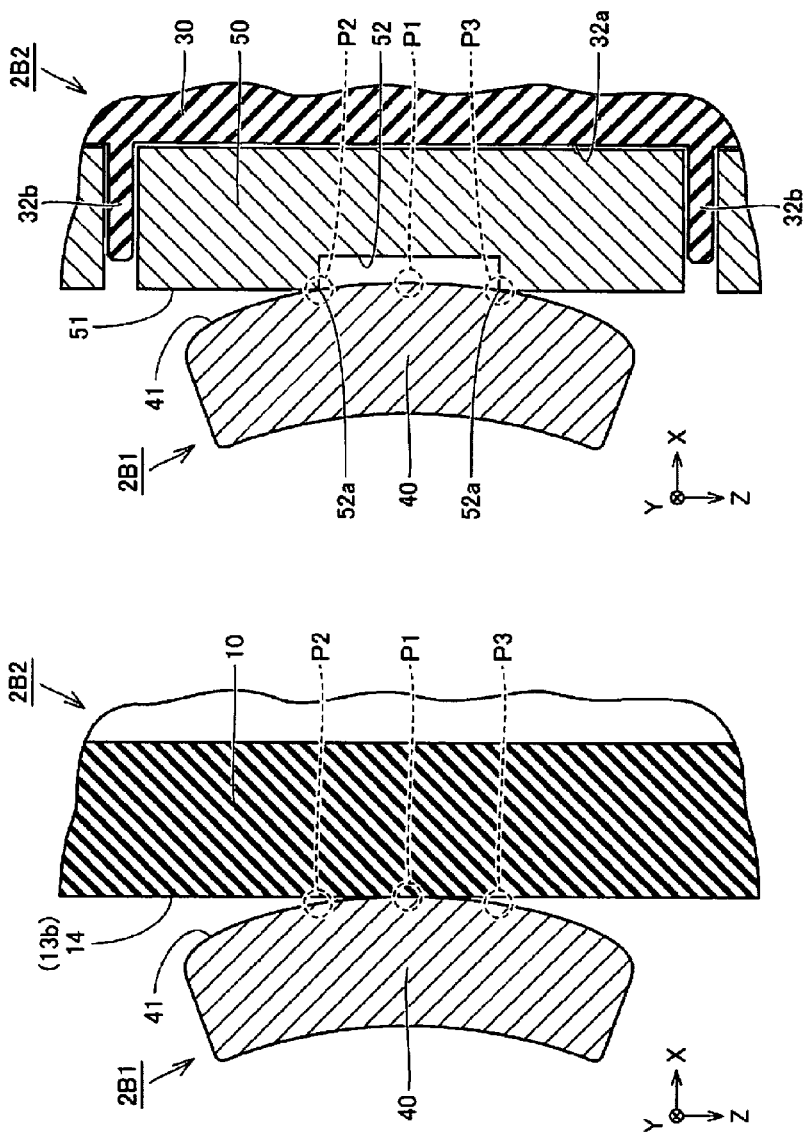

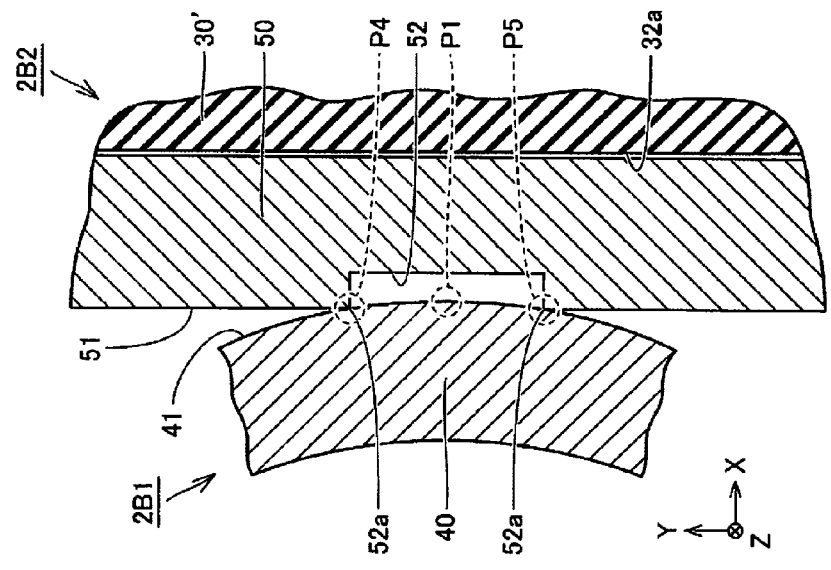
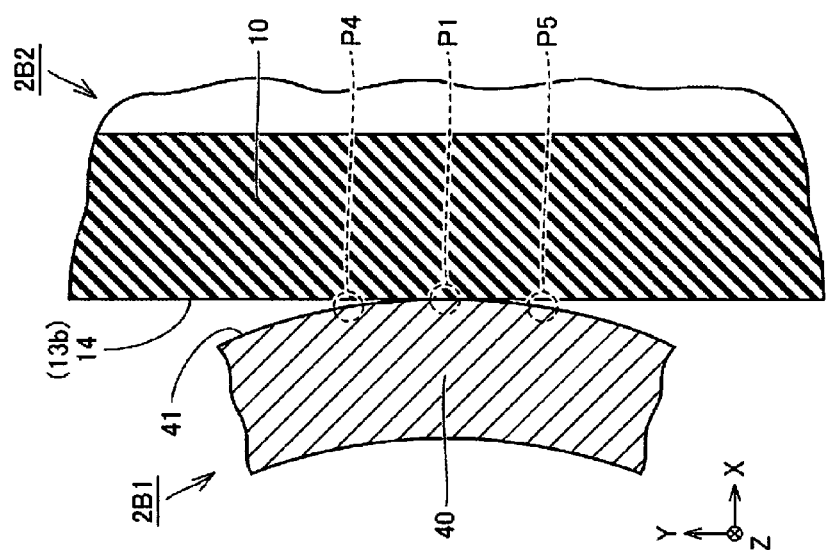
FIG. 11A
FIG. 11B

ELECTRIC DEVICE SYSTEM

CROSS-REFERENCE TO RELATED APPLICATION

This application is based on Japanese Patent Application No. 2015-003104 filed with the Japan Patent Office on Jan. 9, 2015, the entire contents of which are incorporated herein by reference.

FIELD

The present invention relates to an electric device system including a plurality of electric device units.

BACKGROUND

Conventionally, there are various electric device systems including a plurality of electric device units. There is well known an electric device system including the plurality of electric device units, which are electrically connected to each other by assembling the electric device units in line along a predetermined direction. A remote terminal device (hereinafter, also simply referred to as a remote terminal device) of a Programmable Logic Controller (PLC) can be cited as a typical example of the electric device system having the configuration.

The remote terminal device includes a communication unit and one or more I/O unit that can conduct communication with the communication unit through a serial bus line and a unidirectional communication line, and the communication unit and the I/O unit are generally formed into a building block type such that the I/O units are provided in the communication unit while continuously connected to each other.

For example, JP 6-6051 A, JP2001-217016 A, and JP 2012-182412 A disclose the remote terminal device having the configuration.

Frequently, each of the communication unit and I/O unit, which are of the electric device unit, is attached to an attaching rail such as a DIN (German industry standard) rail, and the adjacent electric device units are assembled so as to be engaged with each other.

In such cases, generally a guide groove and a projecting streak that are of a guiding mechanism are provided in a pair of electric device units adjacent to each other, and the projecting streak provided in one of the pair of electric device units is slidably guided by the guide groove provided in the other, whereby the pair of electric device units are detachably engaged with each other. For example, JP2001-217016 A and JP 2012-182412 A disclose the electric device unit in which the guiding mechanism is provided.

SUMMARY

In the electric device system including the electric device unit in which the guiding mechanism is provided, a first connecting terminal and a second connecting terminal are provided at positions corresponding to outer surfaces of the pair of electric device units adjacent to each other in order to establish the electric connection. Therefore, the first and second connecting terminals are in contact with each other while one of the pair of electric device units is assembled in the other, thereby establishing the electric connection between the electric device units.

In this case, in order to ensure electric conduction between the first and second connecting terminals, it is necessary that at least one of the first and second connecting terminals be provided so as to project from the outer surface of the electric device unit in a non-assembly state, and that at least one of the first and second connecting terminals be configured in an elastically deformable manner in a direction orthogonal to the outer surface.

However, when one of the pair of electric device units is assembled in the other, because one of the connecting terminals projecting from the outer surface of the electric device unit slides on the outer surface of the other connecting terminal, possibly one of the connecting terminals catches a foreign substance such as dust adhering to a casing in the sliding, or catches shavings of a partially-scraped surface of the casing. In such cases, after one of the pair of electric device units is assembled in the other, the foreign substance penetrates between the first and second connecting terminals to block the electric conduction between the first and second connecting terminals, which results in generation of a communication error.

Because the foreign substance is located near a contact point of the first and second connecting terminals even if the foreign substance does not penetrate between the first and second connecting terminals after one of the pair of electric device units is assembled in the other, when impact is applied to the electric device unit from the outside, the foreign substance penetrates between the first and second connecting terminals due to variation of a relative position between the first and second connecting terminals, which causes the electric conduction to be blocked between the first and second connecting terminals to generate the communication error.

An object of the present invention is to provide an electric device system that can prevent blocking of the electric connection between the electric device units.

An electric device system according to one aspect of the present invention includes a plurality of electric device units, which are electrically connected to each other by assembling the electric device units in line along a first direction. The plurality of electric device units include a first unit and a second unit, which are adjacent to each other in an assembly state, and each of the first unit and the second unit includes an insulating casing as an outer shell. A first connecting terminal is provided at a predetermined position in a first outer surface that is a casing surface of the first unit, the casing surface of the first unit facing the second unit in the assembly state, at least a part of the first connecting terminal projecting from the first outer surface in a non-assembly state, the first connecting terminal being elastically deformable in the first direction, and a second connecting terminal is provided at a position in a second outer surface that is a casing surface of the second unit, the casing surface of the second unit facing the first unit in the assembly state, the position in the second outer surface facing the first connecting terminal in the assembly state. A guiding mechanism is provided in the first unit and the second unit, the guiding mechanism slidably guiding the first unit into the second unit along a second direction orthogonal to the first direction to enable the first unit to be assembled in and removed from the second unit, and the guiding mechanism guides the first unit into the second unit in assembling the first unit in the second unit such that the first connecting terminal comes into contact with the second connecting terminal after sliding on the second outer surface. A bulging surface bulging out toward the second unit is provided on an exposed surface of the first connecting terminal located on the second unit side in the assembly state, and a recess is provided on an exposed surface of the second connecting terminal located on the first unit side in the assembly state. In the electric device system, a part of the bulging surface is fitted in the recess in the assembly state, and therefore at least the part of the bulging surface comes into press-contact with at least a part of an opening edge of the recess to establish electric conduction between the first connecting terminal and the second connecting terminal.

In the electric device system, the bulging surface may bulge out such that a bulging amount toward the second unit varies in a third direction orthogonal to the first direction and the second direction, and the recess may include a pair of opening edges facing each other in the third direction. In this case, the first connecting terminal and the second connecting terminal come into press-contact with each other at two points corresponding to the pair of opening edges of the recess in the assembly state. In this case, the recess may include a groove extending along the second direction.

In the electric device system, the bulging surface may bulge out such that a bulging amount toward the second unit varies in the second direction, and the recess may include a pair of opening edges facing each other in the second direction. In this case, the first connecting terminal and the second connecting terminal come into press-contact with each other at two points corresponding to the pair of opening edges of the recess in the assembly state. In this case, the recess may include a groove extending along a third direction orthogonal to both the first direction and the second direction.

In the electric device system, the bulging surface may bulge out such that a bulging amount toward the second unit varies in a third direction orthogonal to the first direction and the second direction while the bulging surface bulges out such that a bulging amount toward the second unit varies in the second direction, and the recess may include a pair of opening edges facing each other in the second direction and a pair of opening edges facing each other in the third direction. In this case, the first connecting terminal and the second connecting terminal come into press-contact with each other at four points corresponding to the four opening edges of the recess in the assembly state.

In the electric device system, the recess may include a recessed portion including an opening edge having a cyclic shape in a plan view. In this case, preferably the bulging surface has a shape corresponding to the opening edge, and the first connecting terminal and the second connecting terminal are in press-contact with each other in a whole circumference of the opening edge in the assembly state.

In the electric device system, the first unit and the second unit may be assembled by attaching the first unit and the second unit to an attaching rail extending along the first direction. In this case, preferably a direction in which the first unit and the second unit are attached to the attaching rail is aligned with the second direction.

In the electric device system, the plurality of electric device units may further include one or more electric device units in addition to the first unit and the second unit. In this case, preferably all pairs of electric device units located adjacent to each other in the plurality of electric device units have an electric connecting structure identical to electric connecting structures of the first unit and the second unit.

Accordingly, the present invention can provide the electric device system that can prevent the blocking of electric connection between electric device units.

BRIEF DESCRIPTION OF THE DRAWINGS

FIG. 1 is a perspective view illustrating an assembly state of a remote terminal device according to a first embodiment of the present invention;

FIG. 2A is a perspective view illustrating a front surface of an I/O unit in FIG. 1 when the I/O unit is viewed from an upper right, FIG. 2B is an enlarged perspective view illustrating a main part of the I/O unit, and FIG. 2C is an enlarged right side view illustrating the main part of the I/O unit;

FIG. 4A is a front view of the I/O unit in FIG. 1, and FIG. 4B is a sectional view of the I/O unit;

FIG. 7A is a schematic sectional view illustrating an electric connecting structure of the main part in the remote terminal device according to the first embodiment of the present invention during the assembly operation, and FIG. 7B is a schematic sectional view illustrating the electric connecting structure of the main part in the remote terminal device after the assembly;

FIG. 11A is a schematic sectional view illustrating an electric connecting structure of a main part in the remote terminal device according to the second embodiment of the present invention during the assembly operation, and FIG. 11B is a schematic sectional view illustrating the electric connecting structure of the main part in the remote terminal device after the assembly.

DETAILED DESCRIPTION

Figure 3A:
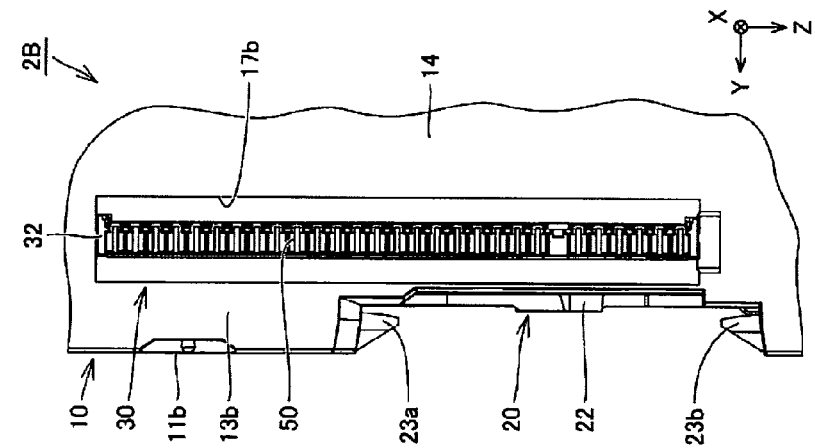
FIG. 3A is a perspective view illustrating a front surface of the I/O unit in FIG. 1 when the I/O unit is viewed from an upper left.

Hereinafter, embodiments of the present invention will be described with reference to the drawings. In the following embodiments, a remote terminal device of a PLC is illustrated as an example of an electric device system to which the present invention is applied. In the following embodiments, the identical or common component is designated by the identical numeral in the drawings, and the overlapping description is omitted.

(First Embodiment)

FIG. 1 is a perspective view illustrating an assembly state of a remote terminal device according to a first embodiment of the present invention. A configuration of a remote terminal device 1 of the first embodiment will be described below with reference to FIG. 1.

As illustrated in FIG. 1, the remote terminal device 1 includes a communication unit 2A, a plurality of I/O units 2B, and an end cover 3. The communication unit 2A, the plurality of I/O units 2B, and the end cover 3 are assembled so as to be arrayed along an X-axis direction of a first direction. The communication unit 2A and the plurality of I/O units 2B correspond to a plurality of electric device units 2 constituting the remote terminal device 1 that is of the electric device system. In the first embodiment, the plurality of I/O units 2B have an identical shape and an identical configuration.

The communication unit 2A is disposed on a leftmost side when the remote terminal device 1 is viewed from a front surface side (viewed along a Y-axis direction of a second direction), and the end cover 3 is disposed on a rightmost side when the remote terminal device 1 is viewed from the front surface side. The plurality of I/O units 2B are disposed between the communication unit 2A and end cover 3, which are disposed at both ends of the I/O units 2B, so as to be continuously connected to each other.

The communication unit 2A is connected to a plurality of I/O units 2B through a serial bus line and a unidirectional communication line, and exchanges control data with each of the plurality of I/O units 2B. The communication unit 2A is connected to an externally-installed PLC (not illustrated) through a cable (not illustrated), and exchanges the control data with the PLC. The communication unit 2A is also equipped with a power supply circuit and a CPU that controls an IN device and an OUT device.

As described above, each of the plurality of I/O units 2B is connected to the communication unit 2A through the serial bus line and the unidirectional communication line, and exchanges the control data with the communication unit 2A. Each of the plurality of I/O units is connected to a sensor and a switch (not illustrated) that are of the IN device and an actuator (not illustrated) that is of the OUT device through a cable (not illustrated), and exchanges the control data with the IN device and the OUT device.

The end cover 3 is a decorative cover that covers an exposed right side surface of the I/O unit 2B, which is located on the rightmost side in the plurality of I/O units 2B when the remote terminal device 1 is viewed from the front surface side.

The communication unit 2A and the plurality of I/O units 2B are attached to a DIN rail 100 of an attaching rail with a fixing member interposed therebetween. In the communication unit 2A and the plurality of I/O units 2B, the adjacent units are engaged with each other while a guiding mechanism provided in each unit is interposed therebetween, the I/O unit 2B located on the rightmost side in the plurality of I/O units 2B and the end cover 3 are also engaged with each other while the guiding mechanism provided in each unit is interposed therebetween. Therefore, the communication unit 2A, the plurality of I/O units 2B, and the end cover 3 are integrally attached to the DIN rail 100.

In the remote terminal device 1 having the above configuration, each of the IN device and OUT device that are connected to the plurality of I/O units 2B conducts communication with the CPU provided in the communication unit 2A, thereby controlling a whole facility to which the remote terminal device 1 is attached. Because the remote terminal device 1 is controlled by the externally-installed PLC, the PLC can integrally control all the plurality of facilities by installing the plurality of remote terminal devices 1 in each facility.

At this point, the plurality of I/O units 2B can be installed as many as the IN devices and OUT devices that are included in the facility to which the remote terminal device 1 is attached. In FIG. 1, although the remote terminal device 1 includes eight I/O units 2B in total, the number of I/O units 2B can be increased and decreased based on the facility to which the remote terminal device 1 is attached.

Figure 3B:
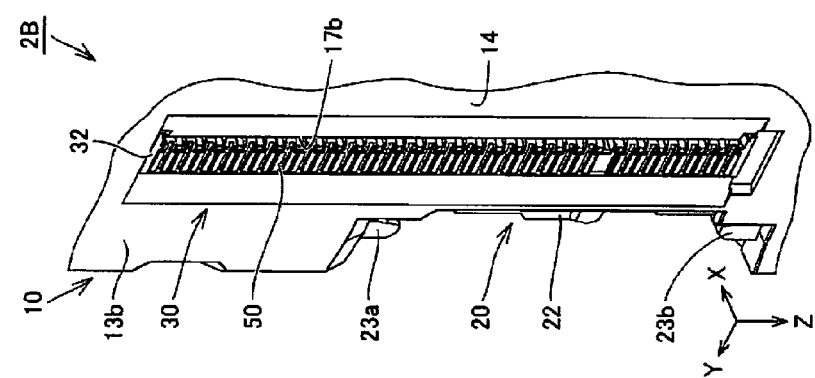
FIG. 3B is an enlarged perspective view illustrating the main part of the I/O unit.
Figure 3C:
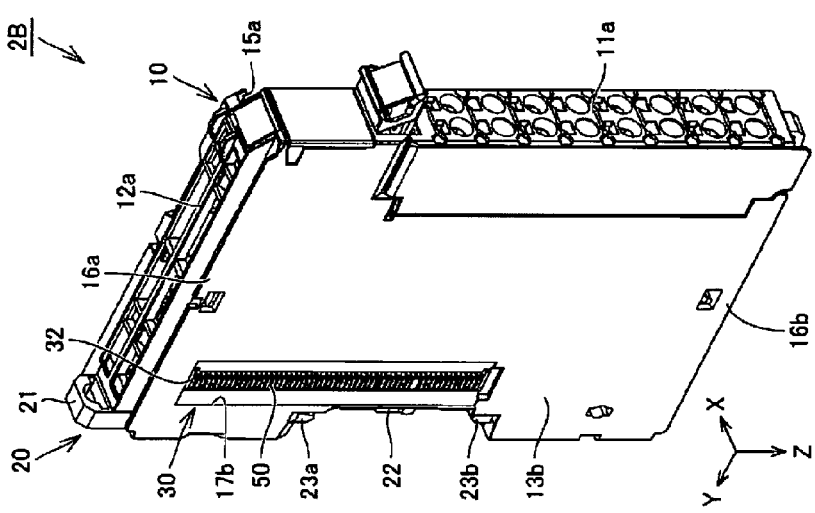
FIG. 3C is an enlarged left side view illustrating the main part of the I/O unit.

FIG. 2A is a perspective view illustrating a front surface of the I/O unit in FIG. 1 when the I/O unit is viewed from an upper right, FIG. 2B is an enlarged perspective view illustrating a main part of the I/O unit, and FIG. 2C is an enlarged right side view illustrating the main part of the I/O unit. FIG. 3A is a perspective view illustrating a front surface of the I/O unit in FIG. 1 when the I/O unit is viewed from an upper left, FIG. 3B is an enlarged perspective view illustrating the main part of the I/O unit, and FIG. 3C is an enlarged left side view illustrating the main part of the I/O unit. FIG. 4A is a front view of the I/O unit in FIG. 1, and FIG. 4B is a sectional view taken on a line IVB-IVB in FIG. 4A. The configuration of the I/O unit 2B will be described below with reference to FIGS. 2 to 4.

As illustrated in FIGS. 2 to 4, the I/O unit 2B has a flat, substantially rectangular parallelepiped external form in which a width in a horizontal width is narrowed. A front surface 11a, a rear surface 11b, a top surface 12a, a bottom surface 12b, a right side surface 13a, and a left side surface 13b of the I/O unit 2B having the substantially rectangular parallelepiped shape are defined by an insulating casing 10 that is of an outer shell.

A plurality of sockets are provided in the front surface 11a of the I/O unit 2B in order to connect the IN device and OUT device to the I/O unit 2B. An end of the cable connected to the IN device or OUT device can be inserted in each of the plurality of sockets, and the inserted end of the cable is held by the socket to provide the electric connection between the I/O unit 2B and the IN device or OUT device.

A fixing member 20 is assembled in the rear surface 11b of the I/O unit 2B in order to attach the I/O unit 2B to the DIN rail 100. The fixing member 20 includes an operating knob 21, a slider 22, and an upper latching pawl 23a and a lower latching pawl 23b that are of a pair of latching pawls. The fixing member 20 is configured such that the upper and lower latching pawls 23a and 23b that are of a pair of latching pawls come closed to or separate from each other by vertically moving the operating knob 21. Therefore, the operating knob 21 is vertically moved while the rear surface 11b of the I/O unit 2B is applied to the DIN rail 100, which allows the I/O unit 2B to be detachably attached to the DIN rail 100.

An upper guide groove 15a and a lower guide groove 15b, which are of a pair of guide grooves, are provided in the right side surface 13a of the I/O unit 2B. The upper guide groove 15a is provided near an end side located on the side of the top surface 12a in the right side surface 13a of the I/O unit 2B, and extends along the Y-axis direction. The lower guide groove 15b is provided near an end side located on the side of the bottom surface 12b in the right side surface 13a of the I/O unit 2B, and extends along the Y-axis direction. The upper guide and lower guide grooves 15a and 15b that are of the pair of guide grooves are provided so as to face each other in a Z-axis direction of a third direction.

An upper projecting streak 16a and a lower projecting streak 16b, which are of a pair of projecting streaks, are provided in the left side surface 13b of the I/O unit 2B. The upper projecting streak 16a is provided near an end side located on the side of the top surface 12a in the left side surface 13b of the I/O unit 2B, and extends along the Y-axis direction. The lower projecting streak 16b is provided near the end side located on the side of the bottom surface 12b in the left side surface 13b of the I/O unit 2B, and extends along the Y-axis direction. The upper projecting streak 16a projects upward along the Z-axis direction, and the lower projecting streak 16b projects downward along the Z-axis direction.

Although the detailed description is omitted, a pair of guide grooves similar to the upper and lower guide grooves 15a and 15b of the pair of guide grooves provided in the right side surface 13a of the I/O unit 2B is also provided in the right side surface of the communication unit 2A, and a pair of guide grooves similar to the upper and lower projecting streak 16a and 16b of the pair of guide grooves provided in the left side surface 13b of the I/O unit 2B is provided in the left side surface of the end cover 3.

The upper and lower guide grooves 15a and 15b, which are of the pair of guide grooves provided in the right side surface 13a of the I/O unit 2B, receive the upper and lower projecting streaks, which are of the pair of projecting streaks provided in the left side surface of the I/O unit 2B or end cover 3 that is disposed while continuously connected on the right side of the I/O unit 2B. The upper and lower projecting streaks 16a and 16b, which are of the pair of projecting streaks provided in the left side surface 13b of the I/O unit 2B, are received by the upper and lower guide grooves, which are of the pair of guide grooves provided in the right side surface of the I/O unit 2B or communication unit 2A that is disposed while continuously connected on the left side of the I/O unit 2B.

That is, the pair of guide grooves and the pair of projecting streaks correspond to the guiding mechanism that engages the adjacent communication unit 2A, a plurality of I/O units 2B, and end cover 3 each two of which are located adjacent to each other. The pair of projecting streaks is slidably guided along the Y-axis direction by the pair of guide grooves, whereby the communication unit 2A, the plurality of I/O units 2B, and the end cover 3 can be separately inserted in and removed from the remote terminal device 1 while the engagement is performed.

As illustrated in FIG. 4B, a terminal block 30 and a wiring circuit board 60 are mainly stored in the casing 10 of the I/O unit 2B. The terminal block 30 and the wiring circuit board 60 are held by the casing 10 while stored in the casing 10.

The terminal block 30 includes a plurality of first connecting terminals 40 and a plurality of second connecting terminals 50 (see FIGS. 2 and 3), and the plurality of first connecting terminals 40 and the plurality of second connecting terminals 50 are electrically connected to a plurality of conductive lines provided corresponding to the wiring circuit boards 60, respectively. The terminal block 30 includes a first terminal surface 31 on which the plurality of first connecting terminals 40 are exposed and a second terminal surface 32 on which the plurality of second connecting terminals 50 are exposed. The terminal block 30 is stored in a space of the casing 10, and the space is located on the sides of the rear surface 11b and top surface 12a of the I/O unit 2B.

The wiring circuit board 60 mainly includes the plurality of conductive lines, is connected to the plurality of first connecting terminals 40 and the plurality of second connecting terminals 50, and is connected to the plurality of sockets provided in the front surface 11a of the I/O unit 2B. The wiring circuit board 60 is stored in a space of the casing 10 so as to be located in front of the terminal block 30.

At this point, the electric conduction is established among the plurality of first connecting terminals 40 and the plurality of second connecting terminals 50, the plurality of conductive lines provided in the wiring circuit board 60, and the plurality of sockets, and the first and second connecting terminals 40 and 50, the conductive lines, and the sockets constitute the serial bus line and the unidirectional communication line.

As illustrated in FIG. 2, a first window 17a is formed at a predetermined position of the right side surface 13a of the I/O unit 2B by partially notching the casing 10, and the terminal block 30 is disposed so as to face the first window 17a. The first terminal surface 31 of the terminal block 30 is provided at a position corresponding to the first window 17a, and the first terminal surface 31 is exposed outward to expose the plurality of first connecting terminals 40.

The first terminal surface 31 of the terminal block 30 extends along the Z-axis direction, and the plurality of first connecting terminals 40 are arrayed in the Z-axis direction at predetermined intervals. The plurality of first connecting terminals 40 are located so as to partially project outward from the right side surface 13a of the I/O unit 2B (particularly, see FIGS. 2B, 4A, and 4B).

As illustrated in FIG. 3, a second window 17b is formed at a predetermined position of the left side surface 13b of the I/O unit 2B by partially notching the casing 10, and the terminal block 30 is disposed so as to face the second window 17b. The second terminal surface 32 of the terminal block 30 is provided at a position corresponding to the second window 17b, and the second terminal surface 32 is exposed outward to expose the plurality of second connecting terminals 50.

The second terminal surface 32 of the terminal block 30 extends along the Z-axis direction, and the plurality of second connecting terminals 50 are arrayed along the Z-axis direction at predetermined intervals. The plurality of second connecting terminals 50 are located so as to be substantially flush with the left side surface 13b of the I/O unit 2B (particularly, see FIGS. 3B and 4B).

Although the detailed description is omitted, a terminal block having a configuration similar to the portion including the first terminal surface 31 of the terminal block 30 provided in the I/O unit 2B is also stored in the casing of the communication unit 2A, a plurality of first connecting terminals are provided in the terminal block, and the plurality of first connecting terminals are exposed on the right side surface of the communication unit 2A.

In the I/O unit 2B, the first and second terminal surfaces 31 and 32 of the terminal block 30 are provided at positions corresponding to the right and left side surfaces 13a and 13b, respectively, of the I/O unit 2B. In the communication unit 2A, the first terminal surface of the terminal block is provided at a position corresponding to the second terminal surface 32 provided in the left side surface 13b of the I/O unit 2B that is disposed while continuously connected to the communication unit 2A.

In the assembly state of FIG. 1, the first terminal surface 31 of one of the pair of adjacent units in the communication unit 2A and a plurality of I/O units 2B and the second terminal surface 32 of the other unit are located so as to face each other, whereby the plurality of first connecting terminals 40 disposed in the first terminal surface 31 of one of the adjacent units and the plurality of second connecting terminals 50 disposed in the second terminal surface 32 of the other unit are in contact with each other, respectively. Accordingly, the pair of adjacent units are electrically connected to each other, and the remote terminal device 1 includes the communication unit 2A and a plurality of I/O units 2B that are electrically connected to one another.

Figure 5A:
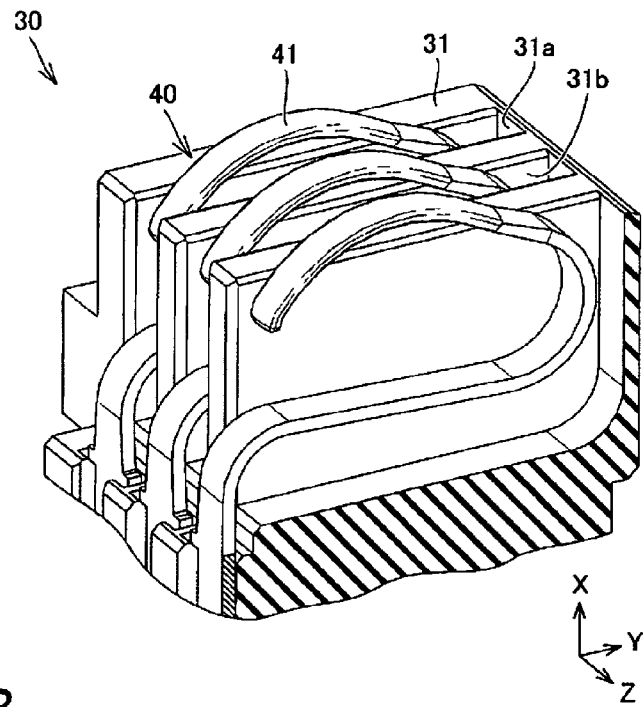
FIG. 5A is a partially broken and perspective view illustrating a terminal block including a first connecting terminal of the I/O unit in FIG. 1.
Figure 5B:
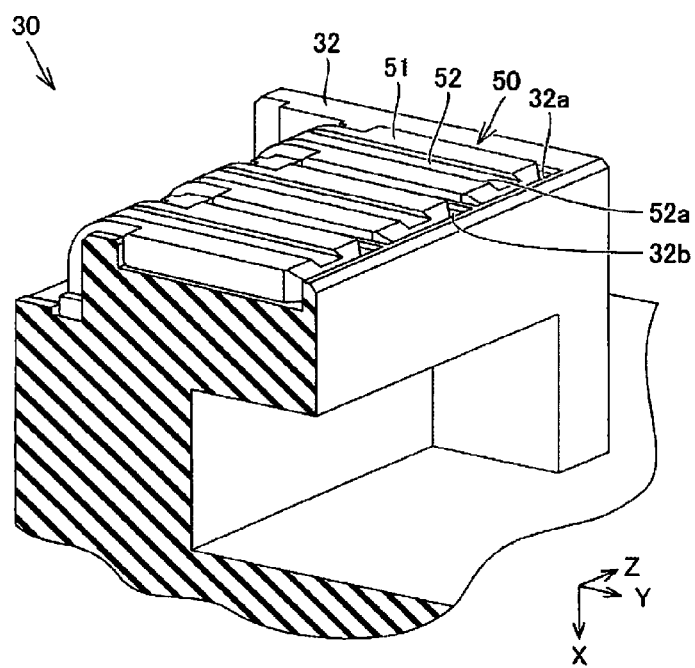
FIG. 5B is a partially broken and perspective view illustrating the terminal block including a second connecting terminal of the I/O unit.

FIG. 5A is a partially broken and perspective view illustrating the terminal block including the first connecting terminal of the I/O unit in FIG. 1, and FIG. 5B is a partially broken and perspective view illustrating the terminal block including the second connecting terminal of the I/O unit. The detailed configurations of the terminal block 30 and the first connecting terminal 40 and second connecting terminal 50 that are included in the terminal block 30 will be described below with reference to FIG. 5.

As illustrated in FIG. 5A, a plurality of groove-shaped first connecting terminal storage parts 31a extending along the Y-axis direction are arrayed along the Z-axis direction at predetermined intervals in the first terminal surface 31 of the terminal block 30. A long and thin, substantially flat first connecting terminal 40 to which bending is subjected is stored in each of the plurality of first connecting terminal storage parts 31a, and the plurality of first connecting terminals 40 are separated from each other by an insulating partition wall 31b located between the first connecting terminals 40.

Each of the plurality of first connecting terminals 40 is subjected to the bending to extend a portion close to a leading end of the first connecting terminal 40 along the substantial Y-axis direction, and the portion close to the leading end projects outward (that is, toward the X-axis direction) from the first connecting terminal storage part 31a.

In the portion projecting streak from the first connecting terminal storage part 31a, a portion close to the leading end of the first connecting terminal 40 is formed into a shape bulging outward, thereby forming a bulging surface 41 in an exposed surface of a region facing the outside of the portion close to the leading end.

At this point, the bulging surface 41 is bulged such that an outwardly bulging amount varies in the Y-axis direction, and such that an outwardly bulging amount varies in the Z-axis direction. More particularly, the bulging surface 41 is curved into a mountainous shape along both the Y-axis direction and the Z-axis direction.

As described above, each of the plurality of first connecting terminals 40 is subjected to the bending, which provides elasticity to the first connecting terminal 40. Particularly, the first connecting terminal 40 is configured so as to be elastically deformable in the X-axis direction.

On the other hand, as illustrated in FIG. 5B, a plurality of groove-shaped second connecting terminal storage parts 32a extending along the Y-axis direction are also arrayed along the Z-axis direction at predetermined intervals in the second terminal surface 32 of the terminal block 30. A long and thin, substantially flat second connecting terminal 50 to which the bending is subjected is stored in each of the plurality of second connecting terminal storage parts 32a, and the plurality of second connecting terminals 50 are separated from each other by an insulating partition wall 32b located between the second connecting terminals 50.

An exposed surface 51 at the leading end of each of the plurality of second connecting terminals 50 is formed into a substantially flat surface, and a recess 52 is provided at a predetermined position of the exposed surface 51. The recess 52 is formed by a rectangular groove extending along the Y-axis direction, and the recess 52 is provided at a central position in the Z-axis direction of the exposed surface 51 of the second connecting terminal 50. In the exposed surfaces 51 of the plurality of second connecting terminals 50, a pair of opening edges 52a of the recess 52 is formed in parallel so as to extend along the Y-axis direction, and the pair of opening edges 52a of the recess 52 is located while facing each other in the Z-axis direction. The pair of opening edges 52a of the recess 52 is a boundary between the exposed surface 51 and the recess 52.

As described above, the terminal block having the configuration similar to the portion including the first terminal surface 31 of the terminal block 30 provided in the I/O unit 2B is also provided in the communication unit 2A. The detailed configuration of the terminal block is similar to that in FIG. 5A.

Figures 6A, 6B:
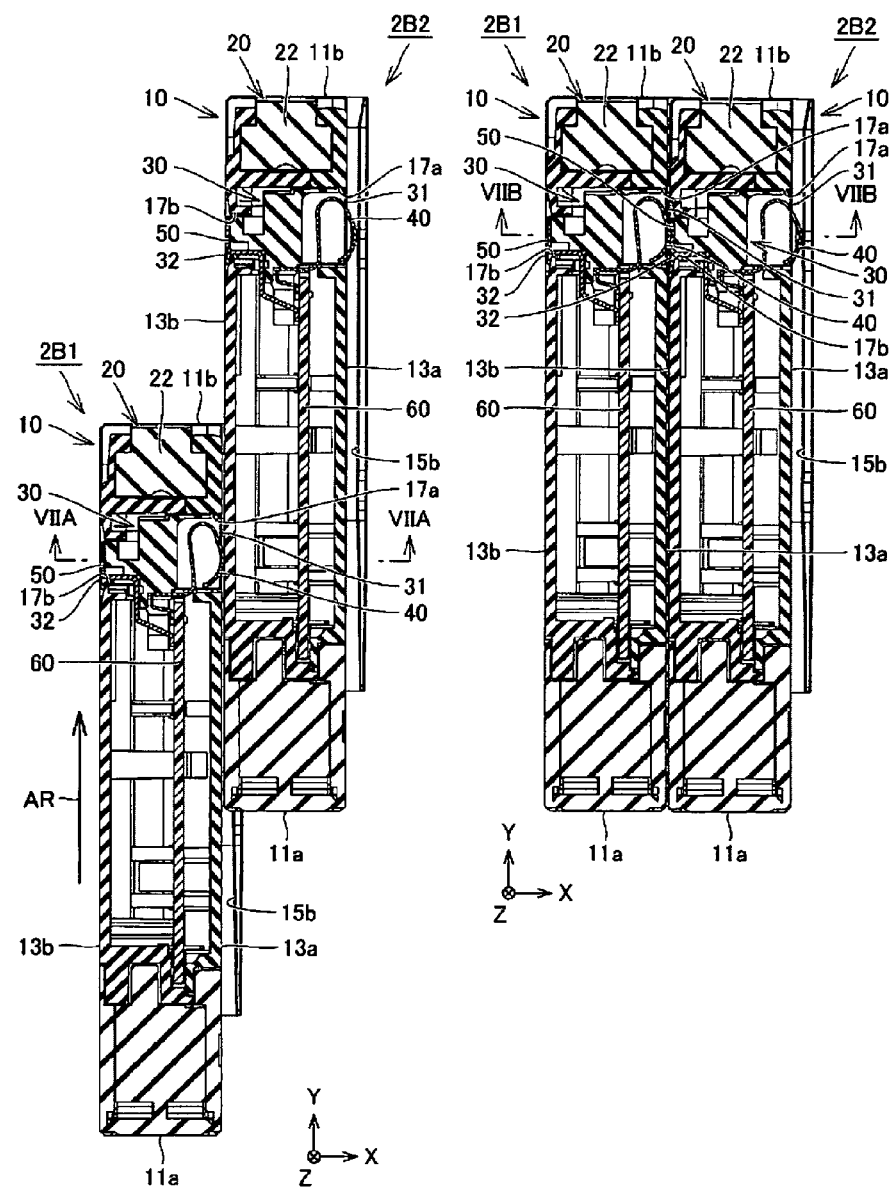
FIG. 6A is a schematic sectional view illustrating an assembly structure of the remote terminal device according to the first embodiment of the present invention during assembly operation.
FIG. 6B is a schematic sectional view illustrating the assembly structure of the remote terminal device after assembly.

FIG. 6A is a schematic sectional view illustrating an assembly structure of the remote terminal device of the first embodiment during assembly operation, and FIG. 6B is a schematic sectional view illustrating the assembly structure of the remote terminal device after assembly. FIG. 7A is a schematic sectional view illustrating an electric connecting structure of the main part in the remote terminal device of the first embodiment during the assembly operation, and FIG. 7B is a schematic sectional view illustrating the electric connecting structure in the main part in the remote terminal device after the assembly. At this point, the section in FIG. 7A is taken along a line VIIA-VIIA in FIG. 6A, and the section in FIG. 7B is taken along a line VIIB-VIIB in FIG. 6B. An assembly structure and an electric connecting structure of the remote terminal device 1 of the first embodiment will be described in detail below with reference to FIGS. 6 and 7.

The following description focuses only on a first unit 2B1 and a second unit 2B2, which are of two I/O units located adjacent to each other in the plurality of I/O units 2B of FIG. 1. The first unit 2B1 is located on the left when the remote terminal device 1 is viewed from the front side (that is, viewed along the Y-axis direction), and the second unit 2B2 is located on the right when the remote terminal device 1 is viewed from the front side. By way of example, the first unit 2B1 is assembled in the second unit 2B2 by inserting the first unit 2B1 in the second unit 2B2.

As illustrated in FIG. 6A, in assembling the first unit 2B1 in the second unit 2B2, the right side surface 13a that is of a first outer surface of the first unit 2B1 is moved toward a direction of an arrow AR from the front surface side so as to applied to the left side surface 13b that is of a second outer surface of the second unit 2B2. At this point, the upper and lower projecting streaks 16a and 16b that are of the pair of projecting streaks provided in the left side surface 13b of the second unit 2B2 are inserted in the upper and lower guide grooves 15a and 15b that are of the pair of guide grooves provided in the right side surface 13a of the first unit 2B1. Therefore, the first unit 2B1 is guided by the second unit 2B2, and slidably moved along the Y-axis direction.

At this point, the plurality of first connecting terminals 40 provided so as to project from the right side surface 13a of the first unit 2B1 interferes with the casing 10 of the second unit 2B2. However, as described above, because each of the plurality of first connecting terminals 40 is elastically deformable along the X-axis direction, the first connecting terminal 40 is elastically deformed so as to recede toward the inside of the first unit 2B1 as illustrated in FIG. 7A, and the first connecting terminal 40 slides on an outer surface 14 of the casing 10 defining the left side surface 13b of the second unit 2B2.

As described above, because the bulging surface 41 bulging outward (that is, toward the second unit 2B2) is formed in the exposed surface of each of the plurality of first connecting terminals 40, the first connecting terminal 40 and the outer surface 14 of the casing 10 of the second unit 2B2 come into contact with each other at a point P1 corresponding to a top of the first connecting terminal 40 located on the side of the second unit 2B2 as illustrated in FIG. 7A.

As illustrated in FIG. 6B, the first unit 2B1 is slidably moved until the first unit 2B1 comes to the position just beside the second unit 2B2, whereby the first terminal surface 31 of the first unit 2B1 is disposed at the position directly confronting the second terminal surface 32 of the second unit 2B2 when the first unit 2B1 is assembled in the second unit 2B2. In the assembly state, the plurality of first connecting terminals 40 provided in the first unit 2B1 are in contact with the plurality of second connecting terminals 50 provided in the second unit 2B2, respectively.

At this point, as described above, because each of the plurality of first connecting terminals 40 is elastically deformable along the X-axis direction, the bulging surface 41 of the first connecting terminal 40 is partially fitted in the recess 52 of the second connecting terminal 50 based on restoring force of the first connecting terminal 40 as illustrated in FIG. 7B. Therefore, the first connecting terminal 40 comes into press-contact with the second connecting terminal 50 at two points corresponding to the pair of opening edges 52a that are located while facing each other in the Z-axis direction of the recess 52 of the second connecting terminal 50.

More specifically, parts of the bulging surface 41 of the first connecting terminal 40 come into press-contact with the pair of opening edges 52a, which are located while facing each other in the Z-axis direction of the recess 52 of the second connecting terminal 50, at points P2 and P3 in FIG. 7B, whereby the electric conduction between the first connecting terminal 40 and the second connecting terminal 50 is established at the contact portions.

Although the detailed description is omitted, in the remote terminal device 1 of the first embodiment, the first unit 2B1 can be removed from the second unit 2B2 by moving the first unit 2B1 toward the front surface from the assembly state in FIG. 6B (toward the direction opposite to the direction of the arrow AR in FIG. 6A).

Although the detailed description is omitted, the communication unit 2A is assembled in and removed from the I/O unit 2B continuously connected to the communication unit 2A in a way basically similar to the assembly and removal of the first unit 2B1 in and from the second unit 2B2.

The remote terminal device 1 of the first embodiment can obtain the following effect compared with the conventional remote terminal device in which the exposed surface includes the flat surface without providing the recess in the exposed surface of the second connecting terminal.

First, in the remote terminal device 1 of the first embodiment, the first connecting terminal 40 slides on the outer surface 14 of the casing 10 in assembling the first unit 2B1 in the second unit 2B2, whereby the first connecting terminal 40 comes into contact with the outer surface 14 at the point P1. On the other hand, the first connecting terminal 40 comes into press-contact with the second connecting terminal 50 at the points P2 and P3 after the first unit 2B1 is assembled in the second unit 2B2. The contact point between the first connecting terminal 40 and the outer surface 14 of the casing 10 is located on the bulging surface 41 different from the contact point between the first connecting terminal 40 and the second connecting terminal 50.

Even if the first connecting terminal 40 catches a foreign substance such as dust adhering to the outer surface 14 of the casing 10 during the sliding, or catches shavings of a partially-scraped outer surface 14 of the casing 10, the foreign substance adheres to the point P1 of the first connecting terminal 40 or in a neighborhood of the point P1, and the foreign substance does not adhere to the points P2 and P3 that are of the contact portion between the first connecting terminal 40 and the second connecting terminal 50 in the neighborhood of the points P2 and P3.

Accordingly, the foreign substance hardly enters the contact portion between the first connecting terminal 40 and the second connecting terminal 50, generation of a communication error due to blocking of the electric conduction between the first connecting terminal 40 and the second connecting terminal 50 can largely be prevented compared with the conventional remote terminal device described above.

Second, in the remote terminal device 1 of the first embodiment, the first connecting terminal 40 and the second connecting terminal 50 come into contact with each other at the points P2 and P3 in the assembly state. Therefore, the electric conduction can be maintained between the first connecting terminal 40 and the second connecting terminal 50 when the foreign substance is not caught at one of the points P2 and P3 even if the foreign substance is caught at the other of the points P2 and P3.

Accordingly, the generation of the communication error due to blocking of the electric conduction between the first connecting terminal 40 and the second connecting terminal 50 can largely be prevented compared with the conventional remote terminal device. Additionally, compared with the conventional remote terminal device, the adoption of the configuration of the remote terminal device 1 increases a contact area between the first connecting terminal 40 and the second connecting terminal 50 to suppress a contact resistance between the first connecting terminal 40 and the second connecting terminal 50.

Third, in the remote terminal device 1 of the first embodiment, the first connecting terminal 40 and the second connecting terminal 50 come into contact with each other at the two points corresponding to the pair of opening edges 52a of the recess 52 of the second connecting terminal 50 in the assembly state. Therefore, in the second connecting terminal 50, by virtue of a relatively angular shape of the contact point with the first connecting terminal 40, the first connecting terminal 40 and the second connecting terminal 50 are in contact with each other with a high contact pressure at the contact point.

Accordingly, even if the foreign substance adheres to the contact portion between the first connecting terminal 40 and the second connecting terminal 50, the foreign substance is swept out when the first connecting terminal 40 slides on the second connecting terminal 50 while being contact with the second connecting terminal 50, a foreign substance removing effect can further be enhanced compared with the conventional remote terminal device described above.

Elastic biasing force (that is, a contact load) applied onto the side of the second unit 2B2 can be lowered in the first connecting terminal 40 by increasing the contact pressure at the contact point between the first connecting terminal 40 and the second connecting terminal 50 as described above. Accordingly, frictional force that is generated when the first connecting terminal 40 slides on the outer surface 14 of the casing 10 while being contact with the outer surface 14 and frictional force that is generated when the first connecting terminal 40 slides on the second connecting terminal 50 while being contact with the second connecting terminal 50 can be lowered compared with the conventional remote terminal device. As a result, force necessary for the insertion and removal of the unit can be lowered even if the remote terminal device 1 of the first embodiment including the many first connecting terminals 40 and many second connecting terminals 50 is used.

In the remote terminal device 1 of the first embodiment, the blocking of the electric connection between the units can be prevented without lowering operability during the insertion and removal of the unit, and reliability of the electric connection between the units can be enhanced higher than before.

FIGS. 8A to 8G are schematic sectional views illustrating various modifications of the second connecting terminal in the remote terminal device of the first embodiment. In the first embodiment, by way of example, the rectangular groove is formed as the recess 52 provided in the exposed surface 51 of the second connecting terminal 50. However, another configuration can be used.

Figure 8A:
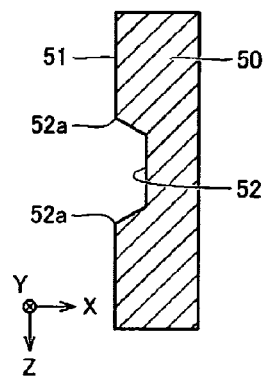
FIGS. 8A to 8G are schematic sectional views illustrating various modifications of the second connecting terminal in the remote terminal device according to the first embodiment of the present invention.
Figure 8B:
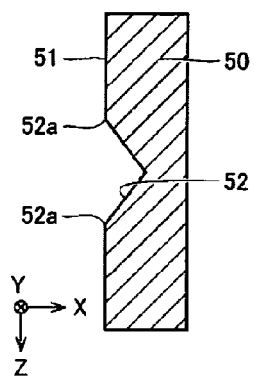
Figure 8C:
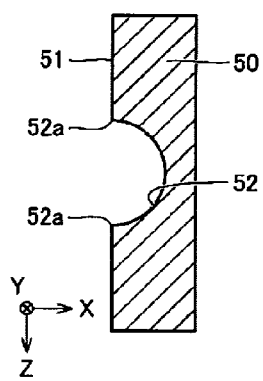
Figure 8D:
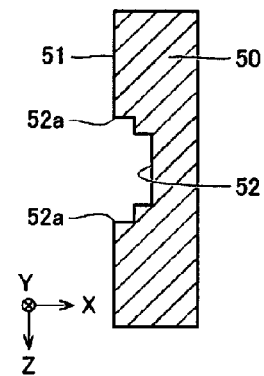

FIG. 8A illustrates the case that the recess 52 provided in the exposed surface 51 of the second connecting terminal 50 includes an inverted trapezoidal groove in which a pair of side surfaces is formed into an inclined shape. FIG. 8B illustrates the case that the recess 52 provided in the exposed surface 51 of the second connecting terminal 50 includes a V-shape groove. FIG. 8C illustrates the case that the recess 52 provided in the exposed surface 51 of the second connecting terminal 50 includes a semi-circular groove. FIG. 8D illustrates the case that the recess 52 provided in the exposed surface 51 of the second connecting terminal 50 includes a two-stage rectangular groove.

As illustrated in FIGS. 8A to 8D, the grooves having various sectional shapes can be used as the recess 52, and the above effect can be obtained in the case that any groove is used.

Figure 8E:
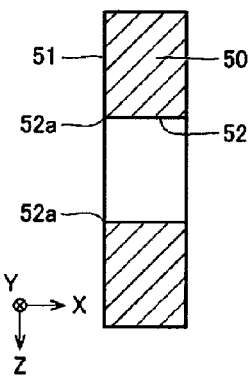

FIG. 8E illustrates the case that the recess 52 provided in the exposed surface 51 of the second connecting terminal 50 includes not the groove but a through-hole.

As illustrated in FIG. 8E, the recess 52 is not necessarily formed into the groove shape, but the through-hole can be made as the recess 52. The above effect can be obtained even if the configuration in FIG. 8E is used.

Figure 8F:
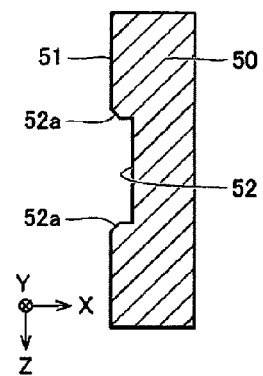
Figure 8G:
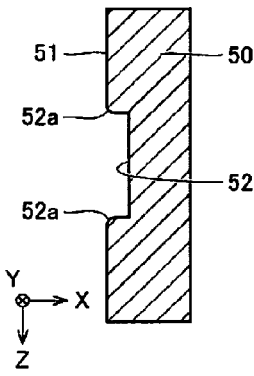

FIG. 8F illustrates the case that a boundary between the exposed surface 51 and the recess 52, which defines the opening edge 52a of the recess 52, includes the inclined surface although the rectangular groove is used as the recess 52 provided in the exposed surface 51 of the second connecting terminal 50. FIG. 8G illustrates the case that the boundary between the exposed surface 51 and the recess 52, which define the opening edge 52a of the recess 52, includes a curved surface although the rectangular groove is used as the recess 52 provided in the exposed surface 51 of the second connecting terminal 50.

As illustrated in FIGS. 8F and 8G, the opening edge 52a of the recess 52 has various shapes, and the above effect can be obtained even if the configurations in FIGS. 8F and 8G are used.

FIGS. 9A to 9E are schematic sectional views illustrating various modifications of the first connecting terminal in the remote terminal device of the first embodiment. In the first embodiment, the substantially flat first connecting terminal 40 in which the portion close to the leading end of the first connecting terminal 40 has the mountainously-curved shape along the Z-axis direction is used by way of example, the portion close to the leading end being in contact with the second connecting terminal 50. Alternatively, the first connecting terminal 40 having another shape may be used.

Figure 9A:
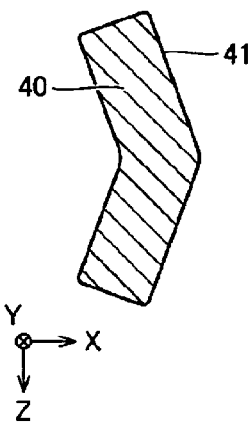
FIGS. 9A to 9E are schematic sectional views illustrating various modifications of the first connecting terminal in the remote terminal device according to the first embodiment of the present invention.
Figure 9B:
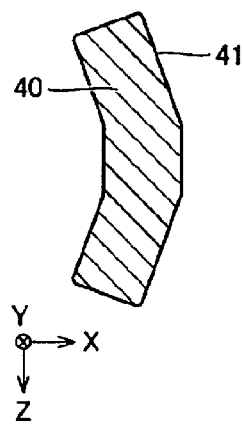

FIG. 9A illustrates the case that the portion close to the leading end of the first connecting terminal 40 is partially bent in the Z-axis direction and formed into a V-shape in a sectional view, the portion close to the leading end being in contact with the second connecting terminal 50, and therefore the bulging surface 41 is formed. FIG. 9B illustrates the case that the portion close to the leading end of the first connecting terminal 40 is bent stepwise in the Z-axis direction, the portion close to the leading end being in contact with the second connecting terminal 50, and therefore the bulging surface 41 is formed.

As illustrated in FIGS. 9A and 9B, the bulging surface 41 of the first connecting terminal 40 is not necessarily bent, but the bulging surface 41 may be formed by a combination of the inclined surfaces. In such cases, the above effect can also be obtained.

Figure 9C:
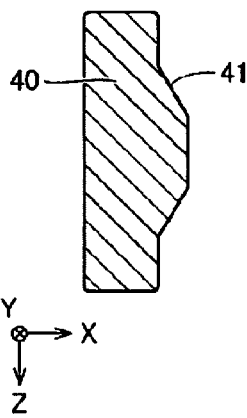
Figure 9D:
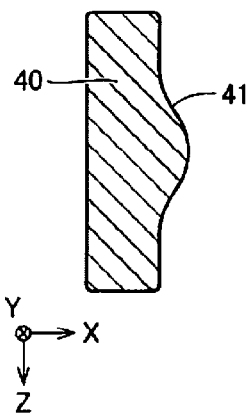

FIG. 9C illustrates the case that the bulging surface 41 is formed by providing a bulging portion having a trapezoidal shape in a sectional view in a part of the flat first connecting terminal 40. FIG. 9D illustrates the case that the bulging surface 41 is formed by providing a bulging portion having a mountainous shape in a sectional view in a part of the flat first connecting terminal 40.

As illustrated in FIGS. 9C and 9D, the bulging surface 41 of the first connecting terminal 40 is not necessarily formed by bending or folding the first connecting terminal 40, but the bulging surface 41 may be formed by locally shaping the bulging portion through pressing. In such cases, the above effect can also be obtained.

Figure 9E:
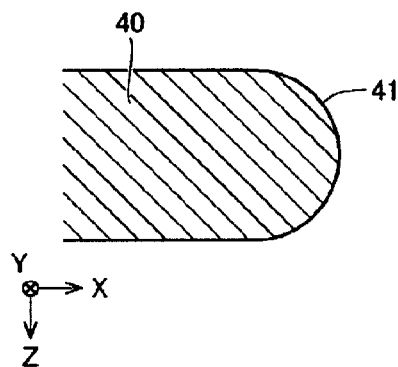

FIG. 9E illustrates the case that the first connecting terminal 40 is formed by a pin-shaped or projection member projecting streak in the X-axis direction instead of the flat first connecting terminal 40 and that the leading end of the first connecting terminal 40 is formed into a semi-circular shape in a sectional view. In this case, because the first connecting terminal 40 does not have the elasticity in the X-axis direction, a biasing spring or the like is provided so as to be engaged with the first connecting terminal 40, thereby providing the elasticity to the first connecting terminal 40.

As illustrated in FIG. 9E, the first connecting terminal 40 does not necessarily have a plate spring shape, but the first connecting terminal 40 may be formed by a combination of the pin-shaped or projection member and the biasing spring. In such cases, the above effect can also be obtained.

In the first embodiment and modifications thereof, the bulging surface 41 provided in the first connecting terminal 40 in which the outwardly bulging amount varies in the Y-axis direction and the Z-axis direction is used by way of example. However, in the bulging surface 41, the outwardly bulging amount does not necessarily vary in the Y-axis direction, but the above effect can be obtained as long as the outwardly bulging amount varies in the Z-axis direction.

(Second Embodiment)

Figure 10A:
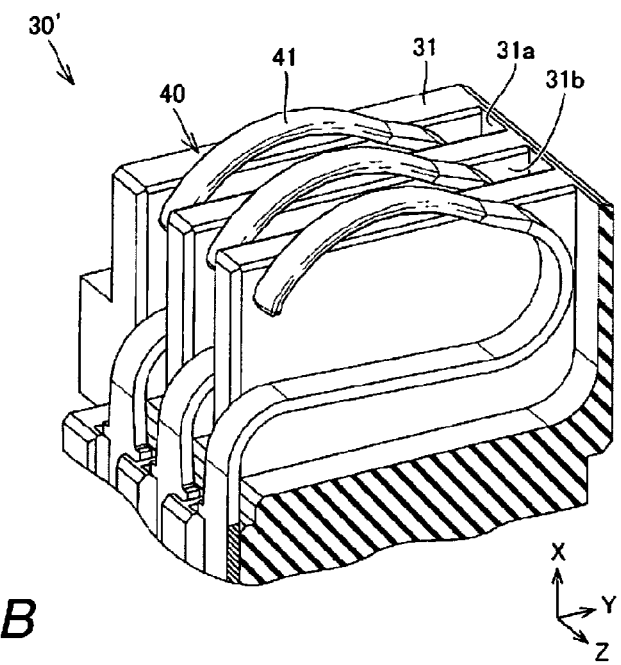
FIG. 10A is a partially broken and perspective view illustrating a terminal block including a first connecting terminal of an I/O unit in a remote terminal device according to a second embodiment of the present invention.
Figure 10B:
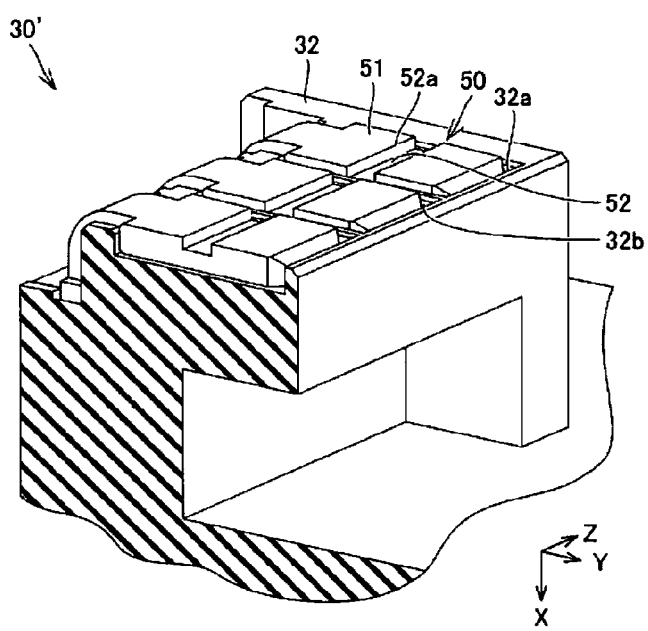
FIG. 10B is a partially broken and perspective view illustrating the terminal block including a second connecting terminal of the I/O unit.

FIG. 10A is a partially broken and perspective view illustrating a terminal block including a first connecting terminal of an I/O unit of a remote terminal device according to a second embodiment of the present invention, and FIG. 10B is a partially broken and perspective view illustrating the terminal block including a second connecting terminal of the I/O unit. Detailed configurations of a terminal block 30' included in the I/O unit of the remote terminal device of the second embodiment and the first connecting terminal 40 and second connecting terminal 50 included in the terminal block 30' will be described with reference to FIG. 5.

As illustrated in FIGS. 10A and 10B, the terminal block 30' of the I/O unit of the remote terminal device has the configuration different from the first embodiment in the plurality of second connecting terminals 50 while having the configuration similar to the first embodiment in the plurality of first connecting terminals 40.

Specifically, as illustrated in FIG. 10B, the recess 52 provided in the exposed surface 51 at the leading end of each of the plurality of second connecting terminals 50 is formed into a rectangular groove shape extending along the Z-axis direction, and one recess 52 is provided at the central position in the Y-axis direction in the exposed surface 51 of the second connecting terminal 50. Therefore, in the exposed surfaces 51 of the plurality of second connecting terminals 50, the pair of opening edges 52a of the recess 52 is formed in parallel so as to extend along the Z-axis direction, and the pair of opening edges 52a of the recess 52 is located while facing each other in the Y-axis direction. The pair of opening edges 52a of the recess 52 is a boundary between the exposed surface 51 and the recess 52.

FIG. 11A is a schematic sectional view illustrating an electric connecting structure of a main part in the remote terminal device of the second embodiment during the assembly operation, and FIG. 11B is a schematic sectional view illustrating the electric connecting structure of the main part in the remote terminal device after the assembly. The electric connecting structure of the remote terminal device of the second embodiment will be described in detail below with reference to FIG. 11.

As illustrated in FIG. 11A, in assembling the first unit 2B1 in the second unit 2B2, similarly to the first embodiment, the first connecting terminal 40 is elastically deformed so as to recede toward the inside of the first unit 2B1, and the first connecting terminal 40 slides on the outer surface 14 defining the left side surface 13b of the second unit 2B2 in the casing 10.

At this point, because the bulging surface 41 bulging outward (that is, toward the second unit 2B2) is formed in the exposed surface of each of the plurality of first connecting terminals 40, the first connecting terminal 40 and the outer surface 14 of the casing 10 of the second unit 2B2 come into contact with each other at a point P1 corresponding to a top of the first connecting terminal 40 located on the side of the second unit 2B2 as illustrated in FIG. 11A.

On the other hand, in the state in which the first unit 2B1 is completely assembled in the second unit 2B2 as illustrated in FIG. 11B, because each of the plurality of first connecting terminals 40 is elastically deformable along the X-axis direction, the bulging surface 41 of the first connecting terminal 40 is partially fitted in the recess 52 of the second connecting terminal 50 based on restoring force of the first connecting terminal 40. Therefore, the first connecting terminal 40 comes into press-contact with the second connecting terminal 50 at two points corresponding to the pair of opening edges 52a that are located while facing each other in the Y-axis direction of the recess 52 of the second connecting terminal 50.

More specifically, parts of the bulging surface 41 of the first connecting terminal 40 come into press-contact with the pair of opening edges 52a, which are located while facing each other in the Y-axis direction of the recess 52 of the second connecting terminal 50, at points P4 and P5 in FIG. 7B, whereby the electric conduction between the first connecting terminal 40 and the second connecting terminal 50 is established at the contact portions.

In the remote terminal device of the second embodiment, the effect substantially similar to that of the first embodiment is obtained, the blocking of the electric connection between the units can be prevented without lowering the operability during the insertion and removal of the unit, and the reliability of the electric connection between the units can be enhanced higher than before.

In the second embodiment, although the detailed description is omitted, the grooves or through-holes having various sectional shapes can be formed as the recess 52 provided in the exposed surface 51 of the second connecting terminal 50 similarly to the first embodiment. Additionally, the first connecting terminal 40 of the portion being in contact with the second connecting terminal 50 is not limited to the bulging surface 41 including the curved surface formed by the bending, but the bulging surface 41 may include the folded surface formed by the folding, the bulging surface 41 may be constructed by locally providing the bulging portion through the pressing, or the bulging surface 41 may be constructed by the combination of the pin-shaped or projection member and the biasing spring.

In the second embodiment, the bulging surface 41 provided in the first connecting terminal 40 in which the outwardly bulging amount varies in the Y-axis direction and the Z-axis direction is used by way of example. However, in the bulging surface 41, the outwardly bulging amount does not necessarily vary in the Z-axis direction, but the above effect can be obtained as long as the outwardly bulging amount varies in the Y-axis direction.

(Modifications)

FIGS. 12A to 12H are plan views illustrating other modifications of the second connecting terminal in the remote terminal devices according to the first and second embodiments of the present invention.

Figure 12A:
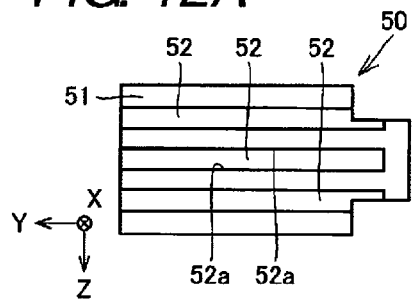
FIGS. 12A to 12H are plan views illustrating various modifications of the second connecting terminal in the remote terminal devices according to the first and second embodiments of the present invention.

FIG. 12A illustrates the case that the plurality of recesses 52, each of which is provided in the exposed surface 51 of the second connecting terminal 50 so as to extend along the Y-axis direction in the first embodiment, are formed in the Z-axis direction. In this case, even if a position shift in the Z-axis direction is generated in the first connecting terminal 40 being in contact with the second connecting terminal 50, the above effect can be obtained by fitting the bulging surface 41 of the first connecting terminal 40 in one of the recesses 52.

In the case that the second connecting terminal 50 having the configuration in FIG. 12A is used, the plurality of bulging surfaces 41 corresponding to the number of recesses 52 are provided along the Z-axis direction in the first connecting terminal 40, and each of the bulging surfaces 41 may be formed so as to be fitted in the recess 52. In this case, the number of contact portions between the first connecting terminal 40 and the second connecting terminal 50 increases to be able to further improve the reliability of the electric connection.

Figure 12B:
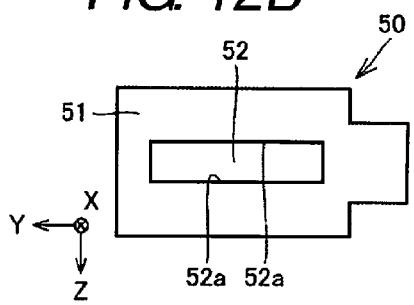

FIG. 12B illustrates the case that the recess 52, which is provided in the exposed surface 51 of the second connecting terminal 50 so as to extend along the Y-axis direction in the first embodiment, includes a groove having a rectangular shape in a plan view such that both ends of the recess 52 are interrupted at middle positions in the exposed surface 51 of the second connecting terminal 50. In this case, the similar effect can also be obtained.

Figure 12C:
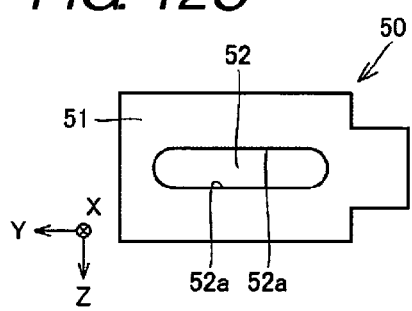

FIG. 12C illustrates the case that the recess 52, which is provided in the exposed surface 51 of the second connecting terminal 50 so as to extend along the Y-axis direction in the first embodiment, includes a groove having an oval shape in a plan view such that both ends of the recess 52 are interrupted at middle positions in the exposed surface 51 of the second connecting terminal 50. In this case, the similar effect can also be obtained.

Figure 12D:
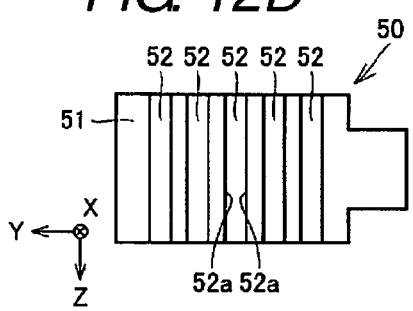

FIG. 12D illustrates the case that the plurality of recesses 52, each of which is provided in the exposed surface 51 of the second connecting terminal 50 so as to extend along the Z-axis direction in the second embodiment, are formed in the Y-axis direction. In this case, even if the position shift in the Y-axis direction is generated in the first connecting terminal 40 being in contact with the second connecting terminal 50, the above effect can be obtained by fitting the bulging surface 41 of the first connecting terminal 40 in one of the recesses 52.

In the case that the second connecting terminal 50 having the configuration in FIG. 12D is used, the plurality of bulging surfaces 41 corresponding to the number of recesses 52 are provided along the Y-axis direction in the first connecting terminal 40, and each of the bulging surfaces 41 may be formed so as to be fitted in the recess 52. In this case, the number of contact portions between the first connecting terminal 40 and the second connecting terminal 50 increases to be able to further improve the reliability of the electric connection.

Figure 12E:
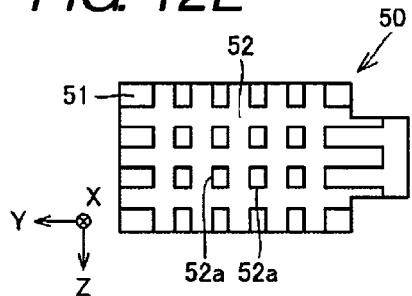

FIG. 12E illustrates the case that the recess 52, which is provided in the exposed surface 51 of the second connecting terminal 50 in the first and second embodiments, includes a groove having a lattice shape in a plan view while including a plurality of grooves extending along the Y-axis direction and a plurality of grooves extending along the Z-axis direction. In this case, even if the position shift is generated in the first connecting terminal 40 being in contact with the second connecting terminal 50, the above effect can be obtained by fitting the bulging surface 41 of the first connecting terminal 40 in any one of portions of the lattice-shape recesses 52.

In the case that the second connecting terminal 50 having the configuration in FIG. 12E is used, the exposed surface of the first connecting terminal 40 is unevenly formed so as to include the plurality of bulging surfaces 41, and each of the bulging surfaces 41 may be formed so as to be fitted in any one of portions of the lattice-shape recess 52. In this case, the number of contact portions between the first connecting terminal 40 and the second connecting terminal 50 increases to be able to further improve the reliability of the electric connection.

Figure 12F:
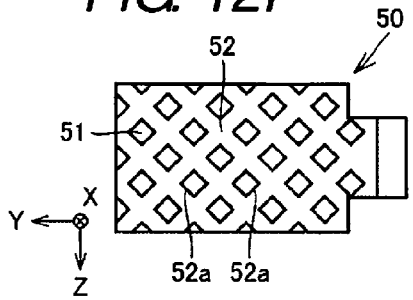

FIG. 12F illustrates the case that the recess 52, which has the lattice shape in a plan view like the configuration in FIG. 12E while including a plurality of grooves intersecting each other, is disposed such that the plurality of grooves of the recess 52 intersect the Y-axis direction of the unit inserting and removing direction. In this case, even if the position shift is generated in the first connecting terminal 40 being in contact with the second connecting terminal 50, the above effect can be obtained by fitting the bulging surface 41 of the first connecting terminal 40 in any one of portions of the lattice-shape recesses 52.

In the case that the second connecting terminal 50 having the configuration in FIG. 12F is used, the exposed surface of the first connecting terminal 40 is unevenly formed so as to include the plurality of bulging surfaces 41, and each of the bulging surfaces 41 may be formed so as to be fitted in any one of portions of the lattice-shape recess 52.

Figure 12G:
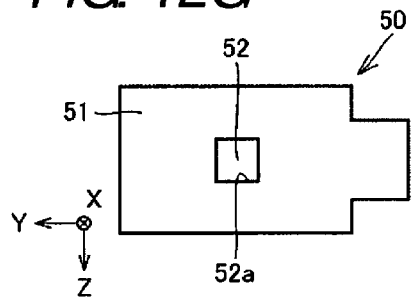

FIG. 12G illustrates the case that the recess 52, which is provided in the exposed surface 51 of the second connecting terminal 50 so as to extend along the Y-axis direction or Z-axis direction in the first and second embodiments, includes a spot-like recess having a rectangular shape in a plan view. In the configuration of FIG. 12G, the first connecting terminal 40 in which the bulging surface 41 is curved into the mountainous shape along both the Y-axis direction and the Z-axis direction is press-contact with the recess 52 at the pair of opening edges 52a facing each other in the Y-axis direction and the pair of opening edges 52a facing each other in the Z-axis direction. Therefore, the similar effect can be obtained, and the reliability of the electric connection can further be improved by increasing the number of contact portions between the first connecting terminal 40 and the second connecting terminal 50.

Figure 12H:
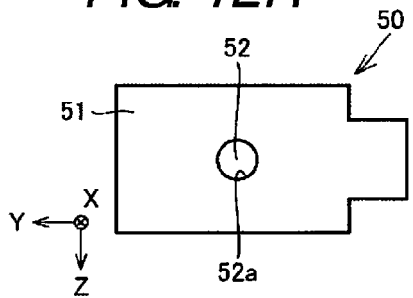

FIG. 12H illustrates the case that the recess 52 provided in the exposed surface 51 of the second connecting terminal 50 includes a spot-like recess having a circular shape in a plan view. In this case, for example, the similar effect can be obtained when the shape of the bulging surface 41 is formed into a semi-spherical shape in the first connecting terminal 40 based on the shape of the opening edge 52a of the recess 52 formed into the circular shape in a plan view.

In the first and second embodiments and the modifications thereof, by way of example, the first connecting terminal and the second connecting terminal are in press-contact with each other only at the position corresponding to the opening edge of the recess of the second connecting terminal in the assembly state. Alternatively, the first connecting terminal and the second connecting terminal may be in press-contact with each other in a partial bulging surface of the first connecting terminal and a partial inner surface of the recess in the portion in which the first connecting terminal is fitted in the recess of the second connecting terminal. For example, the top of the bulging surface of the first connecting terminal may be in further contact with a bottom of the recess.

In the first and second embodiments and the modifications thereof, by way of example, only the first connecting terminal is elastically deformable. Alternatively, the second connecting terminal may be elastically deformable in addition to the first connecting terminal.

In the first and second embodiments and the modifications thereof, by way of example, the present invention is applied to the remote terminal device provided with the I/O units having the identical shape and configuration. However, the I/O units continuously connected to each other do not necessarily have the identical shape and configuration. For example, the present invention can be applied to the remote terminal device provided with the continuously-connected I/O units having different widths.

In the first and second embodiments and the modifications thereof, by way of example, the present invention is applied to the remote terminal device attached to the DIN rail. However, the present invention is not limited to the remote terminal device attached to the DIN rail.

In the first and second embodiments and the modifications thereof, the characteristic configurations can be combined with each other without departing from the scope of the present invention.

In the first and second embodiments and the modifications thereof, by way of example, the present invention is applied to the remote terminal device of the PLC. The present invention is not limited to the remote terminal device of the PLC, but the present invention can also be applied to various electric device systems including at least a pair of electric device units, which are electrically connected to each other while assembled side by side.

The disclosed embodiments and modifications are not restrictive, but is illustrated only by way of example. The technical scope of the present invention is defined by claims, and the meaning equivalent to the scope of the present invention and all changes within the scope are included in the present invention.

The invention claimed is:

1. An electric device system comprising a plurality of electric device units that are electrically connected to each other by assembling the plurality of electric device units in line along a first direction,
   wherein the plurality of electric device units comprises a first unit and a second unit that are adjacent to each other in an assembly state,
   each of the first unit and the second unit comprises an insulating casing as an outer shell,
   a first connecting terminal is provided at a predetermined position in a first outer surface that is a casing surface of the first unit, the casing surface of the first unit facing the second unit in the assembly state, at least a part of the first connecting terminal projecting from the first outer surface in a non-assembly state, the first connecting terminal being elastically deformable in the first direction,
   a second connecting terminal is provided at a position in a second outer surface that is a casing surface of the second unit, the casing surface of the second unit facing the first unit in the assembly state, the position in the second outer surface facing the first connecting terminal in the assembly state,
   a guiding mechanism is provided in the first unit and the second unit, the guiding mechanism slidably guiding the first unit into the second unit along a second direction orthogonal to the first direction to enable the first unit to be assembled in and removed from the second unit,
   the guiding mechanism guides the first unit into the second unit in assembling the first unit in the second unit such that the first connecting terminal comes into contact with the second connecting terminal after sliding on the second outer surface,
   a bulging surface bulging out toward the second unit is provided in an exposed surface of the first connecting terminal located on the second unit side in the assembly state,
   a recess is provided in an exposed surface of the second connecting terminal located on the first unit side in the assembly state, and
   a part of the bulging surface is fitted in the recess in the assembly state, and therefore at least the part of the bulging surface comes into press-contact with at least a part of an opening edge of the recess to establish electric conduction between the first connecting terminal and the second connecting terminal.

2. The electric device system according to claim 1, wherein the bulging surface bulges out such that a bulging amount toward the second unit varies in a third direction orthogonal to the first direction and the second direction,
   the recess comprises a pair of opening edges facing each other in the third direction, and
   the first connecting terminal and the second connecting terminal come into press-contact with each other at two points corresponding to the pair of opening edges of the recess in the assembly state.

3. The electric device system according to claim 2, wherein the recess comprises a groove extending along the second direction.

4. The electric device system according to claim 1, wherein the bulging surface bulges out such that a bulging amount toward the second unit varies in the second direction,
   the recess comprises a pair of opening edges facing each other in the second direction, and
   the first connecting terminal and the second connecting terminal come into press-contact with each other at two points corresponding to the pair of opening edges of the recess in the assembly state.

5. The electric device system according to claim 4, wherein the recess comprises a groove extending along a third direction orthogonal to the first direction and the second direction.

6. The electric device system according to claim 1, wherein the bulging surface bulges out such that a bulging amount toward the second unit varies in a third direction orthogonal to both the first direction and the second direction while the bulging surface bulges out such that a bulging amount toward the second unit varies in the second direction,
   the recess comprises a pair of opening edges facing each other in the second direction and a pair of opening edges facing each other in the third direction, and
   the first connecting terminal and the second connecting terminal come into press-contact with each other at four points corresponding to the four opening edges of the recess in the assembly state.

7. The electric device system according to claim 1, wherein the recess comprises a recessed portion comprising an opening edge having a cyclic shape in a plan view, and
   the bulging surface has a shape corresponding to the opening edge, and the first connecting terminal and the second connecting terminal are in press-contact with each other in a whole circumference of the opening edge in the assembly state.

8. The electric device system according to claim 1, wherein the first unit and the second unit are assembled by attaching the first unit and the second unit to an attaching rail extending along the first direction, and
   a direction in which the first unit and the second unit are attached to the attaching rail is aligned with the second direction.

9. The electric device system according to claim 1, wherein the plurality of electric device units further comprises one or more electric device units in addition to the first unit and the second unit, and
   all pairs of electric device units located adjacent to each other in the plurality of electric device units have an electric connecting structure identical to electric connecting structures of the first unit and the second unit.

\* \* \* \* \*